(12) United States Patent
Godfrey et al.

(10) Patent No.: US 12,025,568 B1
(45) Date of Patent: Jul. 2, 2024

(54) POWER CABLE HEALTH MONITORING METHOD

(71) Applicant: Indeximate Ltd, Hinckley (GB)

(72) Inventors: Alastair Bryan Godfrey, Fleet (GB); Chris D G Minto, Hinckley (GB)

(73) Assignee: Indeximate Ltd., Leicestershire (GB)

( * ) Notice: Subject to any disclaimer, the term of this patent is extended or adjusted under 35 U.S.C. 154(b) by 0 days.

(21) Appl. No.: 18/138,758

(22) Filed: Apr. 25, 2023

(30) Foreign Application Priority Data

Dec. 8, 2022 (GB) .................................... 22185113

(51) Int. Cl.
  *G01N 21/95* (2006.01)
  *G01L 1/24* (2006.01)
  *G01R 31/08* (2020.01)

(52) U.S. Cl.
  CPC .............. *G01N 21/95* (2013.01); *G01L 1/242* (2013.01); *G01R 31/083* (2013.01)

(58) Field of Classification Search
  CPC ......... G01L 1/242; G01L 1/243; G01L 1/245; G01L 1/246; G01L 1/247; G01R 31/08; G01R 31/081; G01R 31/083; G01R 31/085; G01R 31/086
  See application file for complete search history.

(56) References Cited

U.S. PATENT DOCUMENTS

| | | | | |
|---|---|---|---|---|
| 6,237,421 | B1 * | 5/2001 | Li ........................... | G01L 1/242 73/800 |
| 7,154,081 | B1 * | 12/2006 | Friedersdorf ........ | G01M 11/086 250/227.16 |
| 9,746,393 | B2 * | 8/2017 | Godfrey ............. | G01D 5/35358 |
| 10,775,425 | B2 * | 9/2020 | Godfrey ............... | G02B 6/4416 |
| 11,209,472 | B2 * | 12/2021 | Rao ..................... | G01R 33/0327 |
| 11,287,336 | B2 * | 3/2022 | Godfrey .................. | H02G 9/02 |
| 2008/0193126 | A1 * | 8/2008 | Yamamoto ........... | G01M 11/319 374/E11.015 |
| 2011/0176140 | A1 * | 7/2011 | Blin ..................... | G01C 19/721 356/465 |
| 2012/0280117 | A1 * | 11/2012 | Lewis ................ | G01D 5/35367 385/12 |
| 2013/0154632 | A1 * | 6/2013 | McEwen-King .. | G01R 33/0327 385/100 |
| 2014/0022530 | A1 * | 1/2014 | Farhadiroushan .... | E21B 47/095 356/35.5 |

(Continued)

*Primary Examiner* — John R Lee
(74) *Attorney, Agent, or Firm* — Keusey & Associates, P.C.

(57) ABSTRACT

A power cable monitoring method which can be used to measure the mechanical state of health of subsea power cables. This method uses the magnetic properties of the load-bearing components of the power cable and the current carried by the power cable to apply an alternating force to itself. The only source of force from an alternating current in the cable which is at the fundamental frequency (F0) of the electrical power originates from magnetostriction of the steel armor. This force is predominantly axial. The strength of the F0 signal is used as an indicator of strain in the cable, where changes over time can be used to monitor the mechanical integrity of the cable structure. 2F0 signals are complex sums of axial, radial and tangential forces which are difficult to analyze. The 2F0 signal is therefore predominantly used to normalize the F0 signal.

16 Claims, 4 Drawing Sheets

(56) References Cited

U.S. PATENT DOCUMENTS

| | | | |
|---|---|---|---|
| 2014/0049786 A1* | 2/2014 | Knuepfer | G02B 6/4401 385/101 |
| 2014/0355383 A1* | 12/2014 | McEwen-King | G01H 9/004 367/88 |
| 2015/0040681 A1* | 2/2015 | Sarchi | G01M 5/0025 73/847 |
| 2015/0128706 A1* | 5/2015 | Godfrey | G01H 9/004 73/574 |
| 2016/0178583 A1* | 6/2016 | Ntziachristos | G01N 29/265 73/643 |
| 2018/0094952 A1* | 4/2018 | Handerek | G01H 9/004 |
| 2018/0113037 A1* | 4/2018 | Molteni | G01D 5/35361 |
| 2018/0180658 A1* | 6/2018 | Godfrey | G01R 33/0327 |
| 2020/0249106 A1* | 8/2020 | Godfrey | G01L 1/24 |

* cited by examiner

POWER CABLE HEALTH MONITORING METHOD

BACKGROUND OF THE INVENTION

This application relates to the identification of mechanical faults in electrical power cables (1) using signals received by fiber optic cables (3) which are mechanically coupled with the power cable.

Electrical transmission power cables are important and expensive pieces of infrastructure, and their failure is expensive to locate and repair. This is especially true for buried and subsea power cables. Typically, the failure process is slow. The outer covering may become abraded or damaged by impacts, then wear or corrosion of the armor wires begins to occur. Fatigue may also be an issue, with heavily loaded strands of the armor wire (7) breaking and transferring stress to other wires in an ever-increasing cycle to failure.

If this gradual degradation of the cable can be detected measures can be put in place which slow down or prevent this process. This detection is difficult, and often the first that is known about this gradual failure process is when catastrophic failure has occurred. It may be understood by one skilled in the art that the construction of high voltage transmission lines is complex, with water blocking, shielding, strengthening, packing and conducting components (2). This needs to be considered in the discussion below on measurement of strain within the cable, and how that strain relates to the gradual failure of the cable.

One method of measuring strain within a power cable is the use of distributed fiber optic sensing. This is especially accessible for this application since many of the power cables already in existence have fiber optic cables contained within the cable structure for other purposes. There are several different fiber sensing approaches to measuring strain, however any of these approaches that takes more than ~10 seconds to make a measurement (for example Distributed Strain Sensing, DSS) has very limited use due to the nature of the fiber cable construction. The fibers within the power cables are typically of 'loose tube' construction, this means that over longer timescales they are not well coupled to the mechanical strain state of the power cable. Rayleigh backscatter approaches can be used to sensitively measure change in strain state very rapidly (>1000 times per second). This approach is generally known as Distributed Acoustic Sensing or DAS and is the most applicable to the methodology described below. However, one skilled in the art will understand that other fiber sensing approaches could be used, for example Fiber Bragg Gratings or high speed DSS and the use of DAS for the examples below is not intended to limit the idea to DAS. It is also possible that special cables are designed where the fiber is well coupled mechanically to the cable structure. This type of fiber optic cable is known as 'tight buffered' this construction is equally applicable to the invention proposed below.

Due to the (generally) loose tube fiber cable construction, only change in strain can realistically be used for cable analysis. There is some prior art where DAS has been used to measure strain change within a power cable to determine some information about the cable, for example burial depth or bends. An example of dynamic strain related measurements that have been made on comparable structures are on the cabling for suspension bridges. Here the acoustic signature of the failure of individual strands within the load-bearing cable can be picked up with microphones or DAS, and this approach may also work for sub-sea cables. This signal is transient in nature and could be difficult to measure in a noisy sub-sea environment for example. This is not the method being presented here.

The power cable experiences forces from a variety of sources in the environment, but the forces being used in this disclosure originate from the electrical current being carried by the cable itself. In a three-phase cable the current flow is not unidirectional, but the electrical power (5) is delivered in a single direction. The forces of interest here are related to the frequency of the current variations within the cable. This frequency will be referred to as the fundamental frequency, F0, and is typically 50 or 60 Hz in AC power cables. In cables carrying DC current, although the current is always in one direction (unlike AC cables) there is also a variation in the amplitude of the current at a known frequency. This is typically 100 or 120 Hz. Both AC and DC cables are appropriate for the invention below to be exploited and the analysis of AC examples is not intended to limit the idea to AC.

In a cable carrying multiple conductors, there will be a force between any two of those conductors if they are both carrying current (the magnetic force). For known currents and cable dimensions, this force is very well defined and easily calculated. For a typical 3 core AC cable, it transpires that there are radial (4) and tangential forces (6) acting on individual conductors, and this force gets transmitted to the fiber (if present) vibrationally in some complex, but detectable, way. The radial and tangential forces can be changed to axial strain in a way determined by the effective Poisson ratio of the overall cable structure. It may be expected that the magnitude of this strain transmission to the fiber may change if the cable is bent or otherwise deformed, and this has been the subject of a previous patent application. It is important to understand that all of these magnetic forces have a minimum frequency of 2*F0. Higher harmonics at n2F¬0, where n is a positive integer, will exist due to distortion originating from the non-linear nature of the deformation within the cable, but no signal on the fiber at a frequency of F0 is expected. Also, no component of the magnetic force is in the axial direction.

The current within the cable can also generate an internal force by another mechanism: magnetostriction of the cable armoring—this is a smaller signal than the signal arising from the current forces. Magnetostriction is a magnetic effect that can occur in ferromagnetic materials where the dimensions of the material depend on the local strength of the magnetic field. This is due to the rotation of magnetic domains within the material as a field is applied and occurs effectively instantaneously. The steel armor (7) present in most power cables happens to show this property of magnetostriction and is the main load bearing component of the cable. The use of steel armor to detect magnetic field changes in a fiber optic cable has been the subject of a previous patent. The magnetostrictive effect is symmetrical about magnetic field, B, =0, and so an alternating current of frequency F0 would be expected to generate a magnetostrictive strain of frequency 2F0 when no bias field is present. Magnetostrictive strain of the armor would transmit a predominantly axial strain to the fiber (8) through the power cable structure. The detectable signal at 2F0 will be a sum of all these individual contributions vibrating in unison at 2F0 (10) in response to the force experienced by the fiber from the relationship between each conductor (9).

SUMMARY OF THE INVENTION

Embodiments of the present invention relate to measurement methods and equipment needed to monitor electrical power cables for mechanical degradation. The degradation is associated with failing strength components of the power cable by fatigue or over stressing. Additionally, or alternatively, the degradation may be due to the reduction in cross sectional area of the strength members by, for example, abrasion or corrosion.

In one embodiment, the Earth's magnetic field is used to provide the magnetic bias. Although this field is small, it is well known. Changes in the direction of the cable relative to the magnetic field would result in a change of bias, and therefore a change in the amplitude of the signal at a frequency of F0. Following along a spatially varying cable, this will provide a gradually varying background to the F0 signal proportionate to the local earth's magnetic field which can be normalized to reveal local variations which when compared to the relatively invariant 2F¬0 signal are dependent on cable distortion, anomalies and tensile stresses.

In a further embodiment current loading of the cable which is axially stressed induces a degree of permanent magnetism in the ferromagnetic armor strands which is spatially tied to locations of maximum strain thereby creating the magnetic bias and thus affecting the F0 signal.

In some embodiments a bias field may be deliberately created or enhanced, for example by magnetizing the armor during deployment. The response of the cable to the magnetic field could also be tailored by the choice of material and processing of the armor.

In one embodiment, the current being carried by the cable itself can generate the bias field. In DC cables, the current itself generates a very significant bias field, and the DC ripple can be used to generate the F0 strain signal.

In a further embodiment, the electrical current can be measured with separate instrumentation, and the fiber sensing signal correlated to the electrical signal of one of the conductors in the cable for better signal to noise ratio. This methodology is an example of an approach that can also reveal any phase shifts over time, although others exist. Phase shifts can also indicate change in the mechanical state of the cable because this implies the mechanical load is being distributed differently round the circumference of the cable. An alternative approach to using a separate sensor to correlate with the signal is to use the average of all the cable and/or some specifically chosen reference channels. For example, the reference channels may be near the start of the cable close to noisy transformers.

These embodiments described above represent examples of possible methods of exploiting the asymmetry generated with a bias field. One skilled in the art would be able to envisage other methodologies of making use of this effect. These examples should not limit the scope of this invention.

DETAILED DESCRIPTION OF THE INVENTION

The inventors have realized that if a local magnetic bias field is present the magnetic asymmetry (12) caused would lead to an additional F0 frequency component (13) to the strain signal received on the fiber. If present, this F0 signal would be solely related to axial cable forces. Calculations and measurements have revealed that bias fields of varying origin and strength exist in practical cables. This is partly due to the Earth's magnetic field (11) and partly from any residual or induced magnetism of the steel.

The inventors have further realized that the magnitude of the magnetostrictive strain is strongly dependent on the axial tensile stress of the armor wires. Any change to the (current normalized) F0 strain signal (amplitude or phase) implies a change in either the bias field or the tensile stress of the cable strength members. Since the amplitude of the signal at frequency 2F0 is largely unaffected by the state of bias, the change in the ratio of the signals at frequencies of F0 and 2F0 can be used as an indicator of the change in axial strain state.

The mechanism by which the tensile loading of the armor affects the magnitude of the magnetostrictive strain is well documented in the literature. Increasing tensile stress strongly decreases the magnitude of magnetostrictive strain for a given field change. Compressive stress has a much smaller effect. A sudden increase in tensile loading of a section of the cable (from, for example, a failed armor wire) would result in a sudden decrease of the magnetostrictive strain component. This would show up mainly in the F0 frequency band where this signal is not obscured by other larger factors. This change in signal can be used to inform the power cable owners about highly stressed areas in need of maintenance before cable failure occurs. It will be understood by one skilled in the art that any odd multiple of F0 could also be used to track these changes. These harmonics exist due to the non-linearity of the response of the system to magnetic field changes.

Figure 1:
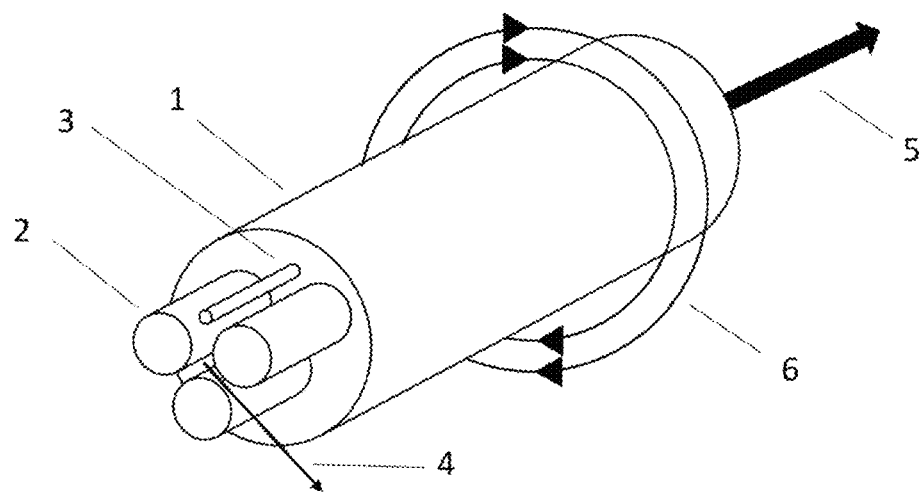
FIG. 1: An electrical power cable (1) may feature three phase copper conductors (2) and a monitoring fiber optic cable (3), transmittal of electrical power (5) will generate a circumferential magnetic field (6) and generate forces both tangentially (6) and radially (4)
Figure 2:
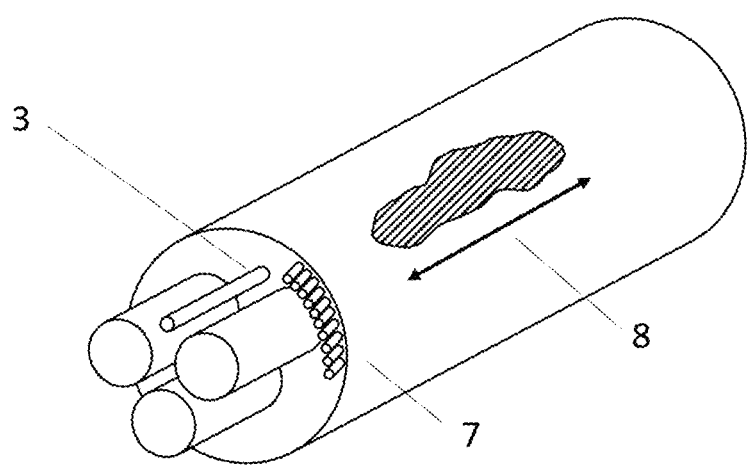
FIG. 2: Power cables typically feature steel helical armor comprised of many individual strands (7). In the presence of the varying magnetic field these exhibit the feature of magnetostriction which causes axial forces in the cable (8) which are transferred through coupling to the fiber optic cable (3)
Figure 3:
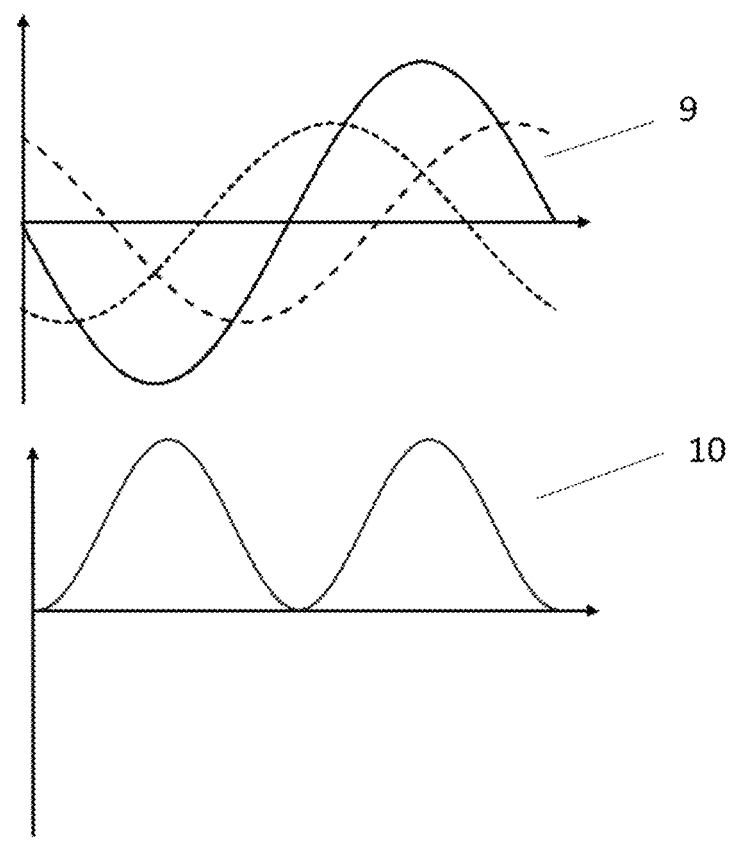
FIG. 3: The three-phase power generation will create a magnetic field measured at an arbitrary point on the circumference of the cable from each of the cores (9). This will generate through the magnetostrictive response a varying strain on the fiber optic cable which features a cyclical response at twice the fundamental frequency of generation 2F0 (10)
Figure 4:
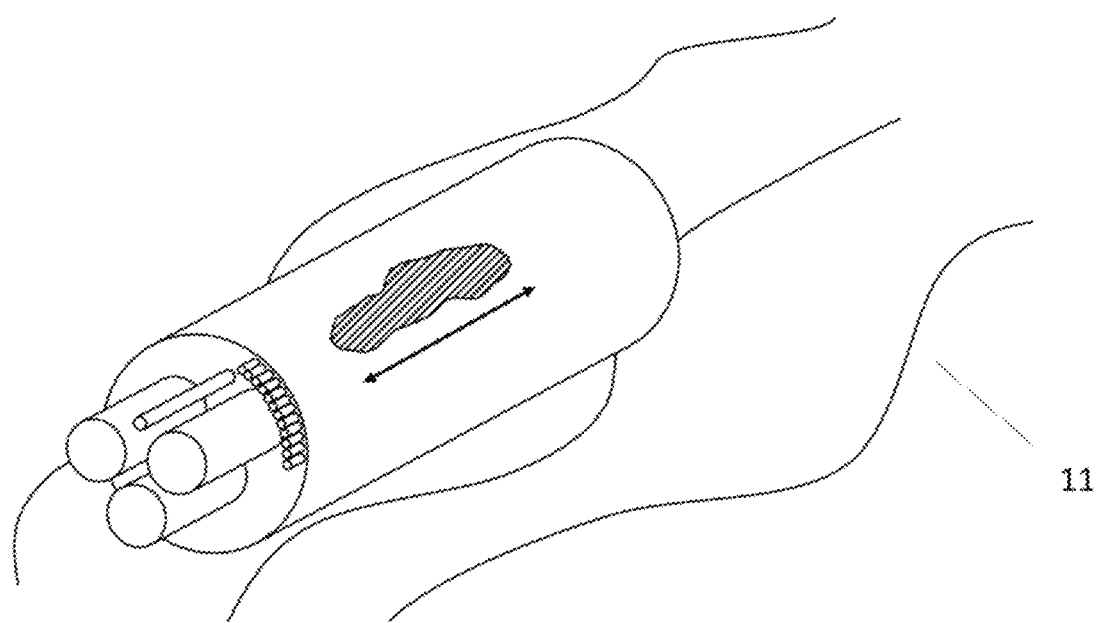
FIG. 4: The cable may experience the presence of a bias field (11) which provides a DC offset to the dynamic magnetic field (shown as the Earth's magnetic field (11) but could additionally be from a range of sources including passive or deliberate magnetization of the armor)
Figure 5:
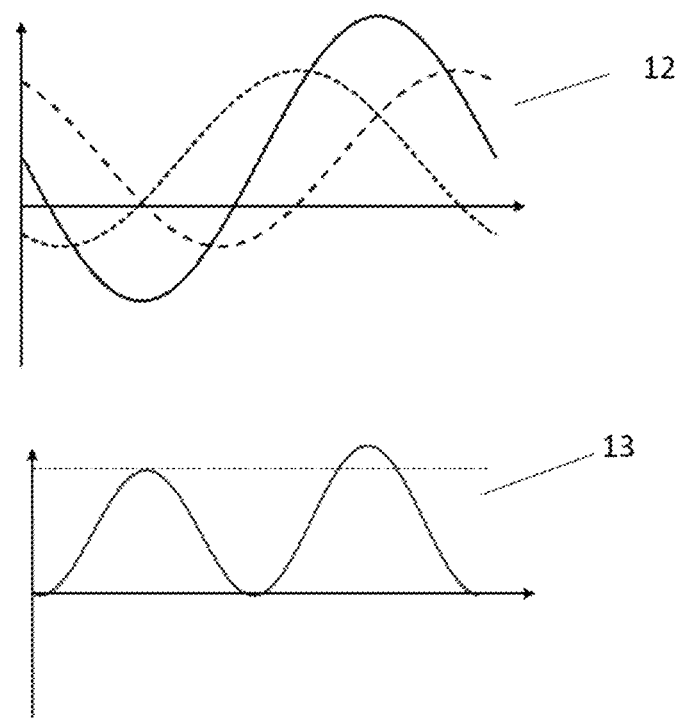
FIG. 5: In the presence of the bias field, the magnetic field at the surface of the cable is modified (12) and the resulting axial strain from the magnetostriction now experiences both the original 2F0 and an additional F0 component as exhibited in the height difference in the peaks
Figure 6:
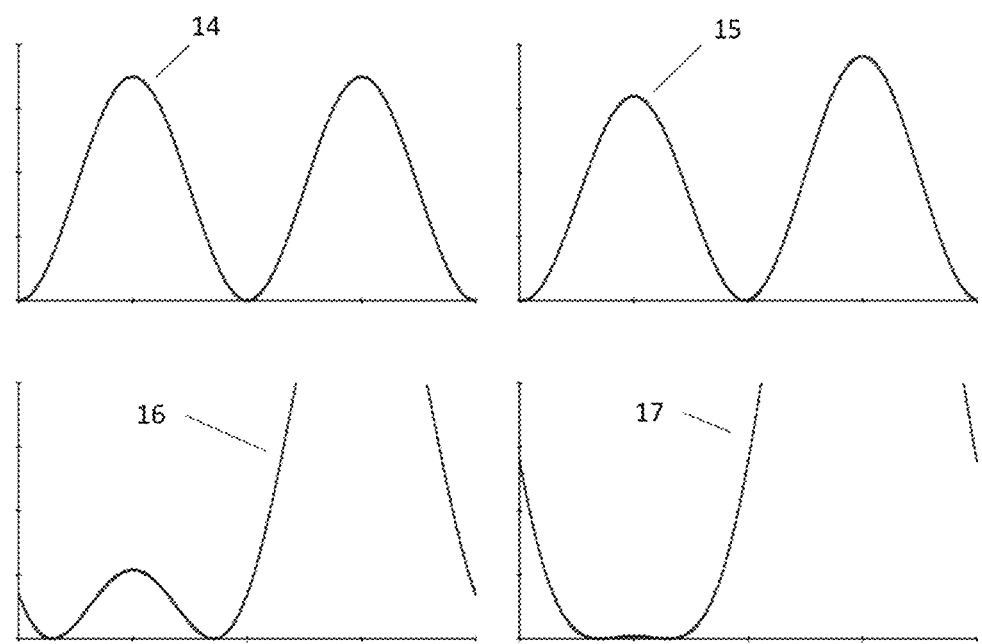
FIG. 6: Varying the strength of the magnetic bias field in a typical cable will alter the axial strain response—free of bias it exhibits 2F0 behavior (14), with the Earth's field we see the emergence of an F0 signal (15) which grows stronger as the field increases (16,17) by additional means

Variation in the level of DC bias signal (FIG. 6) will cause the F0 component to be modulated where the example shows representative power transmission circumstances in an increasing bias field from 0 T (14) to 0.050 mT (15) (approximately equivalent to the Earth's magnetic field) and then on to larger bias of 0.5 mT (16) and 1 mT (17).

A number of signal processing methods can be used to extract the F0 signal from the background noise. One method is to compare the amplitude of the signal in a narrow frequency window around frequency F0 with the signal from a nearby, but distinctly different, frequency window not associated with electrical transmission activity. Another method is to compare with a known reference signal. There are other methods to extract this information, and the examples presented above should not limit the scope of the invention.

Figure 7:
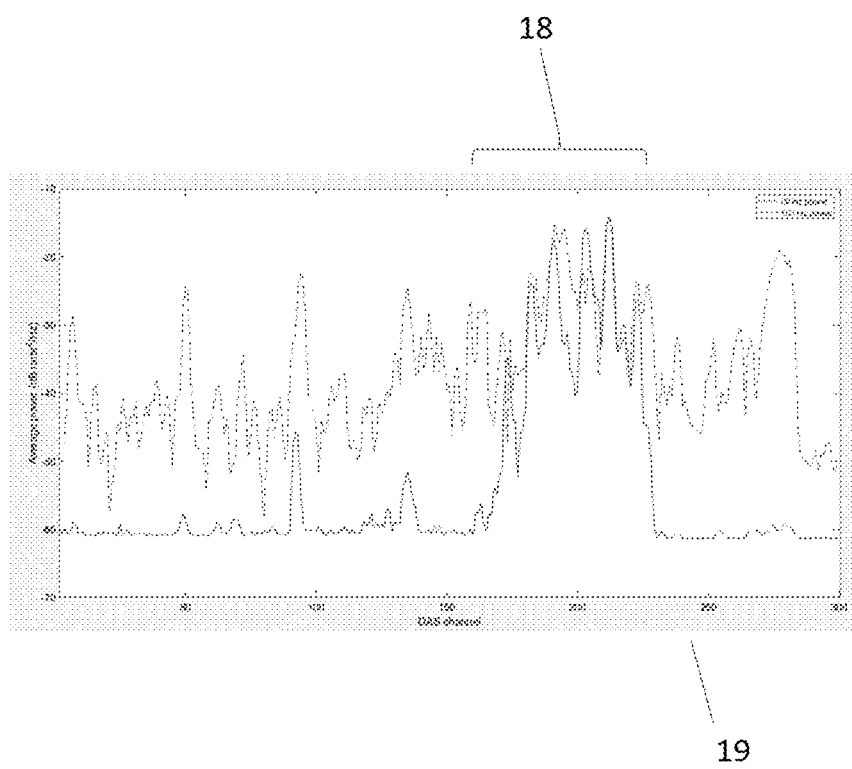
FIG. 7: A plot of the amplitude of the 50 Hz signal and the 100 Hz signal over space. There is a section of the cable with joins, junction boxes and ferromagnetic infrastructure (18) where the magnitude of the 50 Hz signal is clearly stronger. The beach begins at channel 230 (19) and the 50 Hz signal is seen to be much lower after this point. The 100 Hz signal although exhibiting complex behavior is relatively invariant in comparison.

Example 1: In this first example, data is taken from a live subsea power cable running with a fundamental electrical frequency, F0, of 50 Hz. A fiber optic cable is embedded in the power cable structure and a Distributed Acoustic Sensing system is used to extract strain data at all points along the fiber. The measured part of the cable is 30 km long. If the magnitude of the 50 Hz signal from the fiber optic cable is extracted and averaged from about an hour's worth of data, its variation over space can be examined. As shown in FIG. 7, this signal changes with position along the cable. The section of the cable from which this data is extracted shows the contrast between cable running on land, where there are several channels with a large signal, these correspond to junction boxes, joins and other ferromagnetic infrastructure which have influenced the local field bias (18). Once the cable runs out to sea from channel 230 (19) these external influences are absent and the 50 Hz signal drops to a much lower level. The amplitude of the 100 Hz signal shows a different pattern since in this case the sensitivity of the cable to radial and tangential forces is of primary importance rather than the local bias fields.

Figure 8:
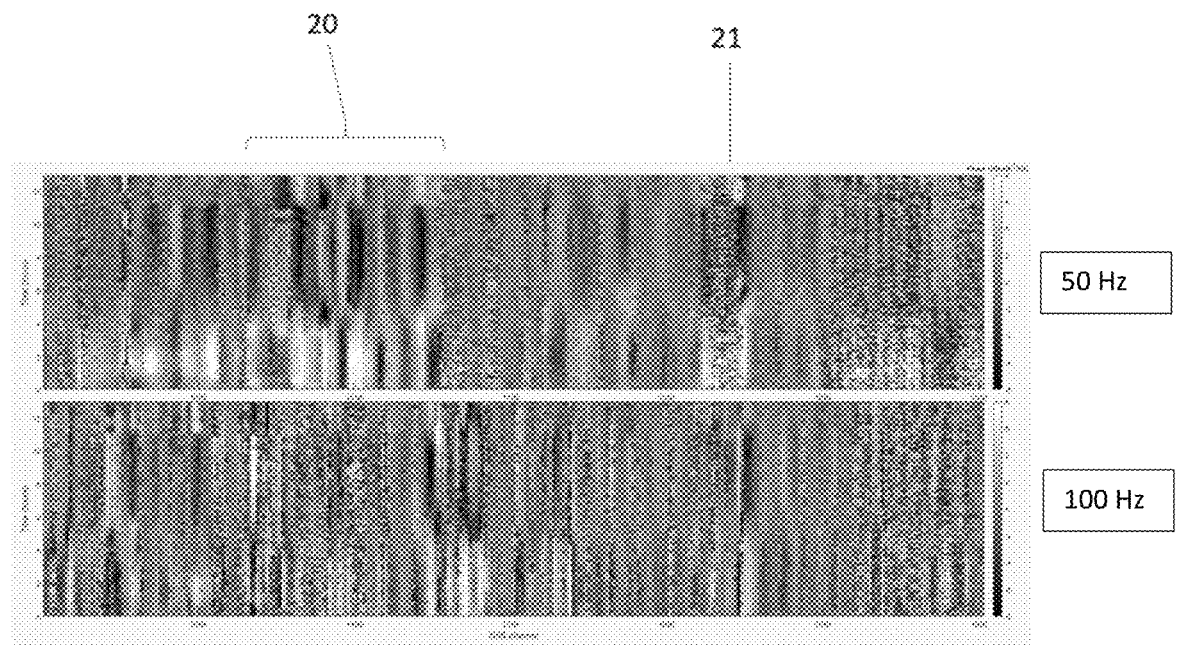
FIG. 8: A plot of the variation over time of the amplitude of the signal at 50 Hz (top) and 100 Hz (bottom). Two regions are highlighted, an area of freespan (20) and a repaired section of cable (21)

Example 2: A particular section of the cable described in example 1 was found to be in free span, i.e., unsupported for significant distances on a sub-sea section. During changes in tidal flow speed the stresses on this cable change due to the drag force exerted by the flowing water. Nearby was a section of cable which had been repaired after past failure, this repair lay exposed on the seabed and was thus also subject to forces from the flowing water. In FIG. 8 the amplitudes over 12 hours of the 50 Hz and 100 Hz signals from one of the locations in free span (20) and the cable repair (21) are plotted. Whilst the amplitude of the 100 Hz signal is stable during a tidal cycle (~6 hours between high flows), the same cannot be said for the amplitude of the 50 Hz signal. This change in amplitude can be attributed to the change in armor stress, and therefore the magnitude of the magnetostrictive response.

The invention claimed is:

1. A power cable health monitoring method for determining degradation in mechanical properties of electrical power cables with distributed fiber optic sensing, comprising the steps of:
   receiving an input signal from an optical fiber coupled with an electrical power cable, wherein the electrical power cable is carrying an electrical current in the presence of a biasing magnetic field and wherein the input signal is a measurement of strain on the optical fiber;
   receiving an electrical current signal from the electrical current, which has a fundamental frequency;
   first measuring the input signal at the fundamental frequency of the electrical current signal and/or odd harmonics thereof and numerically extracting a first measured value of amplitudes or phases;
   second measuring the input signal on the optical fiber at twice the fundamental frequency of the electrical current signal and/or odd harmonics thereof and numerically extracting a second measured value of amplitudes or phases;
   generating a measured value ratio which is a ratio of the first measured value to the second measured value; and
   comparing the measured value ratios over time.

2. The method of claim 1, where the biasing magnetic field is the ambient field from the Earth.

3. The method of claim 1, where the biasing magnetic field is total biasing magnetic field minus the earth's magnetic field resulting in local induced variations.

4. The method of claim 1, where the biasing field originates from passive, accidental or deliberate magnetization of components of the cable.

5. The method of claim 1, where the biasing field originates from a net current flow in the cable being analyzed.

6. The method of claim 1, where the biasing field is generated externally to the cable.

7. The method of claim 1, where a reference electrical signal is used for gain of the fundamental frequency of the current signal.

8. The method of claim 7, wherein the reference electrical signal is obtained from another sensor coupled to the electrical power cable.

9. The method of claim 7, wherein the reference electrical signal is a current signal from a selected location along the length of the optical fiber.

10. The method of claim 1, in which the first and second measured values are amplitudes; and the amplitudes are normalized by the electrical current signal.

11. The method of claim 1, in which the input signal comprises a plurality of channel input signals; each channel input signal is a measurement of strain at a different specific location along the length of the optical fiber; one first and one second measured value is measured for each channel input signal, numerical values are extracted and one measured value ratio is generated for each specific location.

12. The method of claim 11, in which the first and second measured values are amplitudes; and where the amplitudes are normalized by an average over all of the channel input signals of either or both the fundamental frequency of the electrical current signal or the second harmonic frequency of the electrical current signal.

13. The method of claim 11, in which the first and second measured values are amplitudes; and the amplitudes at the fundamental frequency are measured at each location to provide a location-specific fundamental frequency signal and a location-specific second harmonic frequency signal; the amplitudes are normalized relative to either or both of an average of all of the location-specific fundamental frequency signals and/or an average of the location-specific second harmonic frequency signals.

14. The method of claim 11, in which the first and second measured values are amplitudes; and the amplitudes at the fundamental frequency are measured at each location to provide a location-specific fundamental frequency signal and a location-specific second harmonic frequency signal; the amplitudes are normalized relative to a selected one or more of the location-specific fundamental frequency signals and/or the location-specific second harmonic frequency signals.

15. The method of claim 11, in which the first and second measured values are amplitudes; and the amplitudes at the fundamental frequency are measured at each location to provide a location-specific fundamental frequency signal and a location-specific second harmonic frequency signal; each of the fundamental and second harmonic frequency signals has an amplitude, and the amplitudes of the fundamental and second harmonic frequency signals are first normalized at each specific location by the amplitude at (fundamental frequency)–n and (2×fundamental frequency)–n respectively where n represents a small frequency shift to a location away from electrically dominant frequencies to subtract background noise contributions.

16. The method of claim 15, where harmonics of the fundamental frequency which do not coincide with harmonics of the second harmonic frequency (i.e. odd harmonics) are normalized at each specific location by an amplitude at (fundamental frequency)–n and (2×fundamental frequency)–n respectively where n represents a small frequency shift to a location away from electrically dominant frequencies to reveal significant systemic distortion.

* * * * *